United States Patent [19]
Usui

[11] Patent Number: 6,091,080
[45] Date of Patent: Jul. 18, 2000

[54] EVALUATION METHOD FOR WIRINGS OF SEMICONDUCTOR DEVICE

[75] Inventor: Takamasa Usui, Kawasaki, Japan

[73] Assignee: Kabushiki Kaisha Toshiba, Kawasaki, Japan

[21] Appl. No.: 09/104,276

[22] Filed: Jun. 25, 1998

[30] Foreign Application Priority Data

Jun. 27, 1997 [JP] Japan ..................................... 9-171696

[51] Int. Cl.[7] .................................................. H01L 23/58
[52] U.S. Cl. ........................... 257/48; 257/758; 324/519; 324/765; 438/393
[58] Field of Search ..................... 257/48, 758; 324/519, 324/765; 438/393

[56] References Cited

U.S. PATENT DOCUMENTS

| | | | |
|---|---|---|---|
| 4,620,145 | 10/1986 | Dietz et al. | 324/54 |
| 5,684,304 | 11/1997 | Smears | 257/48 |
| 5,686,759 | 11/1997 | Hyde et al. | 257/730 |
| 5,757,027 | 5/1998 | Kuchta | 257/48 |
| 5,777,486 | 7/1998 | Hsu | 324/763 |

FOREIGN PATENT DOCUMENTS

| | | |
|---|---|---|
| 406-295950 | 10/1994 | Japan . |
| 409008091 | 1/1997 | Japan . |
| 409246342 | 9/1997 | Japan . |
| 410135298 | 5/1998 | Japan . |
| 411204607 | 7/1999 | Japan . |
| 411214628 | 8/1999 | Japan . |

*Primary Examiner*—William Mintel
*Attorney, Agent, or Firm*—Finnegan, Henderson, Farabow, Garrett & Dunner, L.L.P.

[57] ABSTRACT

Electromigration (EM) of a multilayer wiring is evaluated accurately and efficiently. A capacitance measuring wiring is disposed through the third insulator film in parallel to the second testing wiring. A stress current is sent to the second testing wiring toward the first testing wiring for a period and subsequently the capacitance of the capacitor composed of the second testing wiring and the capacitance measuring wiring is measured. The volume of voids in the second testing wiring is obtained from the ratio of this capacitance and the capacitance before letting the stress current flow. EM is evaluated by defining the wiring life span by using this volume.

6 Claims, 6 Drawing Sheets

CAPACITANCE MEASURING WIRING

… …

EVALUATION METHOD FOR WIRINGS OF SEMICONDUCTOR DEVICE

BACKGROUND OF THE INVENTION

The present invention relates to a semiconductor device, a method for evaluating wirings and a device for evaluating wirings which are effective for evaluating resistance to electromigration.

Recently, in an important section of a computer or a communication device, large scale integrated circuits (LSI), in which many transistors, resistors and the like are connected to form an electric circuit and integrated on one chip, have been very frequently used. Thus, the performance of such a device, as a whole, is very relevant to the performance of LSI per se. The performance of LSI per se can be improved by heightening an integration degree, that is, by making the element minute or fine.

As the element is made finer, its wirings are also made finer. For LSI, high-speed operation is also required, as well as high integration, whereby the electric current flowing into wirings tends to increase. By making the element finer and due to an increase in the electric current as described above, the electric current flowing through a unit area of a wiring, that is, the current density is increasingly raised.

When the current density is raised, metal atoms constituting a wiring are moved in the direction opposite to the current-flow direction, so that a part of the wiring is gradually made narrow. Eventually, the part may snap off. Such a phenomenon is called electromigration (EM), and is an important factor influencing reliability of a wiring. Therefore, for LSI where the integration degree is heightened, the method for evaluating resistance to EM is an important technique.

As one of the methods for evaluating resistance to EM, there is a known method of increasing in the resistance of a wiring. FIG. 1 illustrates the evaluating system. This is a system for evaluating resistance to EM of a wiring including a contact hole or a via hole.

In FIG. 1, reference number 81 represents the first insulator film. On the first insulator film 81, the first testing wiring 82 is deposited. The first testing wiring 82 is covered with the second insulator film 83. A connecting hole reaching the first testing wiring 82 is formed through the second insulator film 83. The first testing wiring 82 is connected to the second testing wiring 85 through a connecting plug 84 formed inside this connecting hole. The first testing wiring 82 corresponds to a diffused layer (in the case where the connecting hole is a contact hole) or a lower wiring (in the case where the connecting hole is a via hole) in an actual device.

When an electric current I is sent from one end of the second testing wiring 85, the end being at the side away from the connecting plug 84, to the first testing wiring, voids produced in the vicinity of the other end of the second testing wiring 85 grow toward the end at the side away from the connected plug 84. As the voids grow more and more, the resistance rises.

The resistance is calculated from the potential difference between the voltage V1 at the first wiring 82 under the connecting plug 84 and the voltage V2 at the one end of the second wiring 85. This potential difference is measured with a voltmeter (not shown).

The resistance when the current I starts to be sent, and the resistance when the time t passes from the time at which the current I starts to be sent are referred to as R0 and Rt, respectively. A resistance rise rate is represented by (Rt/R0)·100[%]. The time t when the resistance rise rate reaches a specified value (for example, 10[%]) is defined as a wiring life span. Resistance to EM is evaluated by the wiring life span.

However, this sort of method for evaluating resistance to EM has the following problems. That is, the longer the second testing wiring 85 is, the larger the volume of voids is if the rate of resistance increase is the same. Therefore, as the second testing wiring 85 is longer, the wiring life span seems longer. Thus, the wiring life span cannot be evaluated accurately.

In order to accurately evaluate the wiring life span, it is necessary to obtain the volume of voids by calculation from the evaluation result. However, an actual device has wirings having various lengths; thus, design for the device becomes complicated if calculation for all of these wirings is conducted. Such a method is not practical.

On the other hand, if the wiring life span is defined by using the void volume itself, the problem occur that the wiring life span seems longer as the second test wiring 85 is longer does not occur.

However, in order to obtain the void volume, an undesired analysis (destructive test) such as an SEM (scanning electron microscope) analysis becomes necessary. This analysis takes much time, and is not effective.

BRIEF SUMMARY OF THE INVENTION

As described above, as one of the methods for evaluating resistance to EM, there is known a method of using the rate of rise in resistance of a wiring. However, this method has the problem that as a testing wiring is longer, the wiring life span is seemingly longer and consequently the wiring life span cannot be evaluated accurately.

As a method of overcoming such a problem, there is a method of defining the wiring life span by the void volume per se. However, this method requires an undesired analysis (destructive test) such as SEM analysis. Thus, this method takes a lot of time, resulting in the problem of non-efficiency.

The present invention has been accomplished in light of the above. Therefore, the object of the present invention is to provide a semiconductor device, a wiring evaluating method and a wiring evaluating apparatus which make it possible to evaluate resistance to EM of a multilayer wiring accurately and effectively.

The first aspect of the present invention for attaining the object is a semiconductor device having a multilayer wiring structure, comprising a multilayer wiring in which on a first wiring a second wiring is disposed through an insulator film and the first wiring is connected through a connecting member fitted to an opening of the insulator film to the second wiring; and a capacitance measuring wiring which constitutes a capacitor together with the multilayer wiring.

In the present invention, the wording "lower wiring" means a wiring comprising a diffused layer formed on the surface of a semiconductor substrate or a conductive film formed on a semiconductor substrate and below the above-mentioned upper wiring (This is the same in other aspects of the present invention).

The second aspect of the invention is a wiring evaluating method for a multilayer wiring in which on a first wiring a second wiring is disposed through an insulator film and the first wiring is connected through a connecting member fitted to an opening of the insulator film to the second wiring, comprising the steps: disposing a capacitance measuring wiring which constitutes a capacitor together with the multilayer wiring structure; supplying a stress current (a current causing a stress) to the multilayer wiring; and using change in the capacitance of the capacitor to evaluate resistance to electromigration of the multilayer wiring.

The third aspect of the invention is another wiring evaluating method for a multilayer wiring in which on a first wiring a second wiring is disposed through an insulator film and the first wiring is connected through a connecting member fitted to an opening of the insulator film to the second wiring, comprising the steps: disposing a capacitance measuring wiring which constitutes a capacitor together with the multilayer wiring structure; measuring the capacitance of the capacitor before supplying a stress current to the multilayer wiring; supplying the stress current to the multilayer wiring for a period and subsequently measuring the capacitance of the capacitor under the condition of stopping supplying the stress current; obtaining the volume of voids produced in the multilayer wiring by supplying the stress current, from the ratio of capacitances before and after supplying the stress current; and evaluating resistance to electromigration of the multilayer wiring on the basis of the volume of the voids.

The fourth aspect of the invention is still another wiring evaluating method for a multilayer wiring in which on a first wiring a second wiring is disposed through an insulator film and the first wiring is connected through a connecting member fitted to an opening of the insulator film to the second wiring, comprising: the first step of disposing a capacitance measuring wiring which constitutes a capacitor together with the multilayer wiring structure; the second step of measuring the initial capacitance of the capacitor before supplying a stress current to the multilayer wiring; the third step of supplying the stress current to the multilayer wiring for a period and subsequently measuring the capacitance of the capacitor under the condition of stopping supplying the stress current; the fourth step of obtaining the volume of voids produced in the multilayer wiring by supplying the stress current, from the ratio of capacitances obtained in the second and third steps; the fifth step of restarting supplying the stress current and supplying the stress current to the multilayer wiring for a period and subsequently measuring the capacitance of the capacitor under the condition of stopping supplying the stress current; the sixth step of obtaining the volume of voids produced in the multilayer wiring by supplying the stress current, from the ratio of capacitances obtained in the second and fifth steps; the seventh step of repeating the fifth and sixth steps at least once to obtain the volume of the voids a plurality of times; and the eighth step of evaluating resistance to electromigration of the multilayer wiring on the basis of the plural volumes of the voids obtained in the fourth and seventh steps.

Specifically, resistance to electromigration of the multilayer wiring is evaluated, for example, on the basis of an average volume obtained by taking an arithmetic mean of the plural volumes of the voids.

In the invention, the capacitance measuring wiring is disposed to surround at least one part of the first or second wiring, or the connecting member.

The fifth aspect of the invention is a wiring evaluating apparatus for evaluating resistance to electromigration of a multilayer wiring in which on a first wiring a second wiring is disposed through an insulator film and the first wiring is connected through a connecting member fitted to an opening of the insulator film to the second wiring, comprising: a capacitance measuring wiring which constitutes a capacitor together with the multilayer wiring; a stress current supplying device for supplying a stress current to the multilayer wiring; a capacitance measuring device for measuring the capacitance of the capacitor; and an evaluating means for evaluating resistance to electromigration of the multilayer wiring by using data obtained with the capacitance measuring device.

The sixth aspect of the invention is another semiconductor device having a multilayer wiring structure, comprising: a multilayer wiring in which on a first wiring a second wiring is disposed through an insulator film and the first wiring is connected through a connecting member fitted to an opening of the insulator film to the second wiring; and separated capacitance measuring wirings which constitute a capacitor together with the multilayer wiring, whereby the separated capacitance measuring wiring is used to measure the capacitance so as to identify the point where the voids are produced.

According to the present invention, the wiring life span can be defined by the void volume per se. Therefore, the invention does not cause the problem that the wiring life span becomes apparently longer as the testing wiring is longer, which is different from the case of evaluating the wiring life span from the rate of rise in wiring resistance. Since the invention uses capacitance to obtain the volume of voids, the invention does not take much time. This is different from the case of using an undesired analysis (destructive measurement) such as an SEM analysis. The invention therefore makes it possible to evaluate resistance to EM of the multilayer wiring accurately and effectively.

The invention also makes it possible to repeat the same sort of measurement for a single object to be measured, since it is a specimen-nondestructive measurement. Therefore, the wiring life span can be decided on the basis of the plurality of measurement results, according to the invention, thereby making the variation in the measurement results small so as to carry out evaluation with a high precision.

Additional objects and advantages of the invention will be set forth in the description which follows, and in part will be obvious from the description, or may be learned by practice of the invention. The object and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate a presently preferred embodiment of the invention and together with the general description given above and the detailed description of the preferred embodiment given below, serve to explain the principles of the invention.

DETAILED DESCRIPTION OF THE INVENTION

The following will describe embodiments according to the present invention, referring to the attached drawings.
The First Embodiment.

Figure 1:
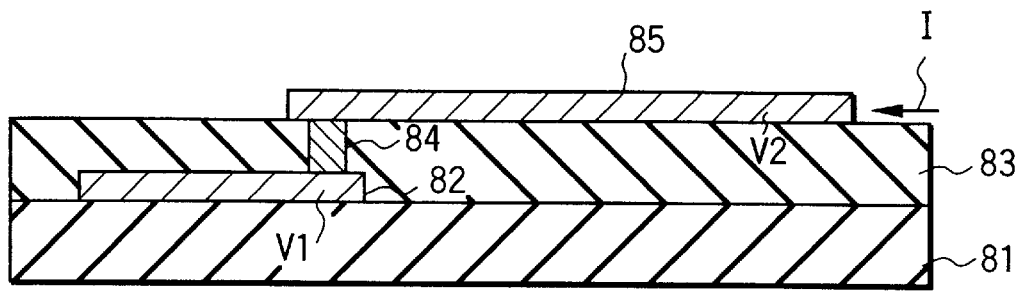
FIG. 1 is a schematic view illustrating a conventional wiring evaluating apparatus.
Figure 2:
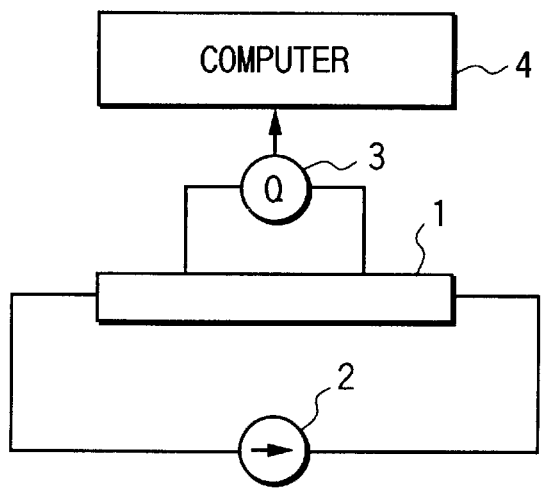
FIG. 2 is a schematic view illustrating a basic structure according to a wiring evaluating apparatus of the first embodiment of the present invention.

FIG. 2 is a schematic view illustrating a basic structure of a wiring evaluating apparatus according to the first embodiment of the present invention.

This wiring evaluating apparatus is mainly composed of a multilayer wiring structure 1, an electric current source 2 for sending an electric current (stress current) having a current density from about $1 \times 10^5$ to about $3 \times 10^6$ A/cm$^2$ to the multilayer wiring structure 1 to cause EM, a capacitance meter 3 for measuring the capacitance of the multilayer wiring structure 1 and a computer 4 for obtaining the volume of the voids produced by EM inside the multilayer wiring structure 1, on the basis of the result obtained with the capacitance meter 3, and evaluating the wiring life span of the multilayer wiring structure 1.

This device actually has a heating mechanism for giving a temperature causing a stress to the multilayer wiring structure 1, (hereinafter called "stress temperature") but the mechanism is omitted in FIG. 2. This heating mechanism may be, for example, an oven. In the present embodiment, the stress temperature may be from about 150 to about 350° C. When the testing wiring is made of Al or Cu, the stress temperature is preferably from about 150 to about 250° C. or from about 150 to 350° C., respectively. In short, the stress temperature may be as high as that in the case of conventional EM evaluation, there is no need to use a special heating mechanism. Thus, the problem of difficulty in evaluation when using a special heating mechanism can be avoided.

Figure 3:
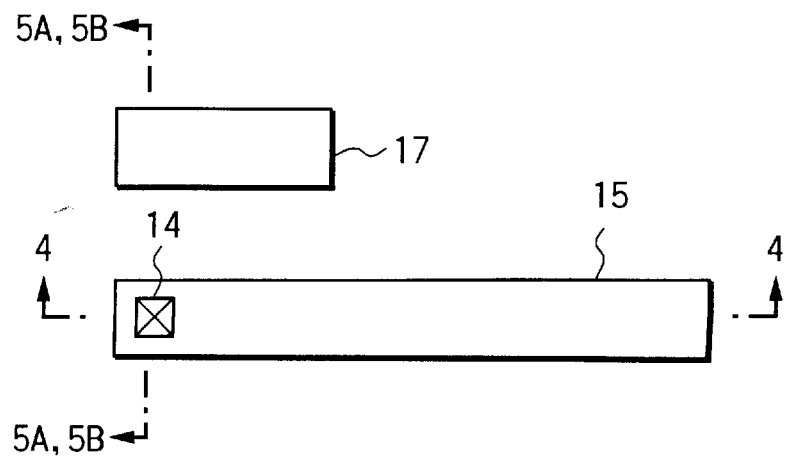
FIG. 3 is a top view illustrating a multilayer wiring structure.
Figure 4:
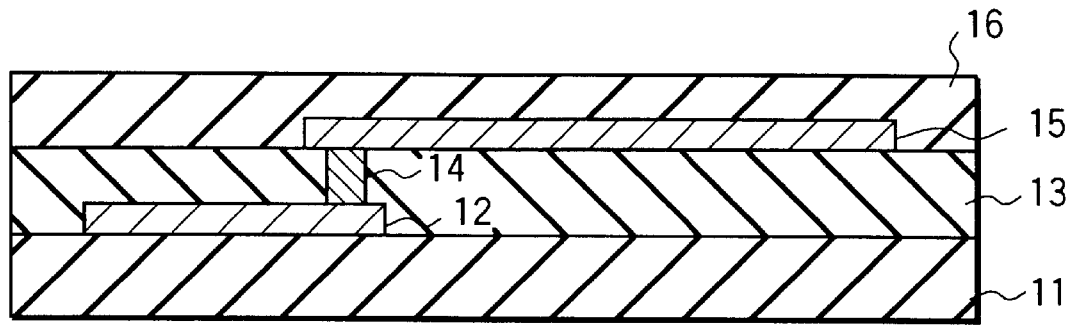
FIG. 4 is an 4—4 section of the multilayer wiring structure shown in FIG. 3.
Figure 5A:
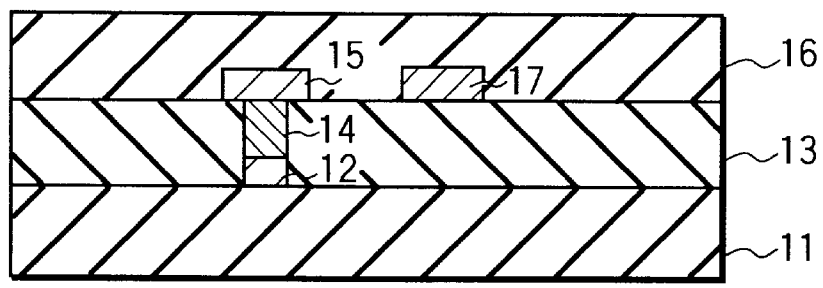
FIGS. 5A and 5B are sectional views of the multilayer wiring structure along a line 5A—5A and a line 5B—5B, respectively.
Figure 5B:
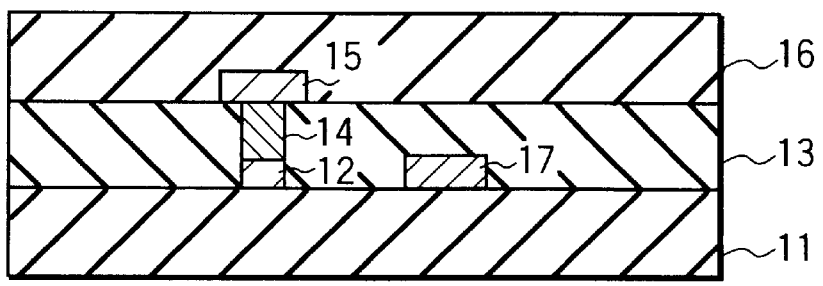

FIG. 3 is a top view of the multilayer wiring structure 1, FIG. 4 is a 4—4 cross section of the multilayer wiring structure 1 shown in FIG. 3, and FIGS. 5A and 5B are a cross sectional views along lines 5A—5A and 5B—5B of the same structure as above, respectively. The basic structure of the multilayer wiring structure 1 is a structure in which a capacitance measuring wiring 17 is added to a conventional multilayer wiring structure.

In these figures, reference number 11 represents the first insulator film, and the first testing wiring 12 is formed on the first insulator film 11. The first testing wiring 12 is covered with the second insulator film 13.

A connecting hole reaching the first testing wiring 12 is formed through the second insulator film 13. The first testing wiring 12 is connected to the second testing wiring 15 through a connecting plug 14 formed inside the connecting hole. The second testing wiring 15 is covered with the third insulator film 16.

The first testing wiring 12 corresponds to a diffused layer (in the case where the connecting hole is a contact hole) or a lower wiring (in the case where the connecting hole is a via hole) in an actual device.

Openings are formed at the first and third insulator films 11 and 16, respectively, in order to connect a terminal of the electric current source 2 to the first and second testing wirings 12 and 15; however, these openings are omitted in any figures.

The structure described above is the same as conventional multilayer wiring structures. As shown in FIGS. 5A and 5B, the difference from the conventional ones is in that a capacitance measuring wiring 17 is fitted through an insulator film to the testing wiring corresponding to the portion to be evaluated.

FIG. 5A illustrates the arrangement of the capacitance measuring wiring 17 in the case of evaluating the second testing wiring 15. The capacitance measuring wiring 17 is arranged, through the third insulator film 16, in parallel to the second testing wiring 15.

In this case, the measuring terminal of the capacitance meter 3 is connected to the capacitance measuring wiring 17 and the second testing wiring 15. Openings necessary for these connections are formed in the insulator film 16. In order to cause EM in the second testing wiring 15, a stress current is sent from the second testing wiring 15 to the first testing wiring 12 for a certain period.

FIG. 5B illustrates the arrangement of the capacitance measuring wiring 17 in the case of evaluating the first testing wiring 12. The capacitance measuring wiring 17 is arranged, through the second insulator film 13, in parallel to the first testing wiring 12.

In this case, the measuring terminals of the capacitance meter 3 are connected to the capacitance measuring wiring 17 and the first testing wiring 12. Openings necessary for these connections are formed in the insulator film 13. In order to cause EM in the first testing wiring 12, a stress current is sent from the second testing wiring 15 to the first testing wiring 12 for a certain period.

The distance between the capacitance measuring wiring 17 and the testing wiring to be evaluated is. preferably as short as possible, within such a range that does not cause the problem of a short circuit, in order to raise measuring sensitivity.

There now follows a description of a method for obtaining the volume of voids produced by EM in the multilayer wiring structure, especially in the second testing wiring 15, on the basis of the result obtained with the capacitance meter 3.

Figure 6:
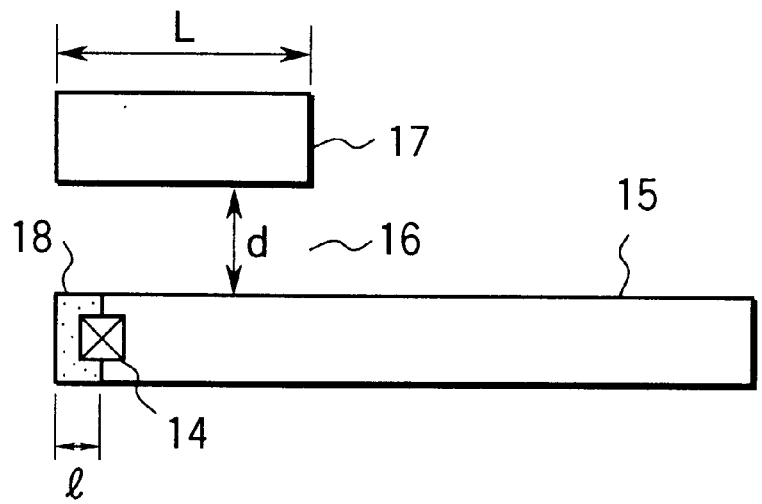
FIG. 6 is a view for explaining the volume of voids in a testing wiring.

As shown in FIG. 6, the length of the capacitance measuring wiring 17, the distance between this wiring 17 and the second testing wiring 15, the length of the void 18 along the longitudinal direction of the second testing wiring 15 and the permittivity of the third insulator film are firstly represented by L, d, l, and $\epsilon_0$, respectively. The thickness of the capacitance measuring wiring 17 is the same as that of the second testing wiring 15, and they are represented by t.

The following describes discuss the capacitance C of the capacitor composed of the capacitance measuring wiring 17, the third insulator film 16 and the second testing wiring 15.

The capacitance C is as follows:

C=$\epsilon_0 \cdot$S/d, wherein the area that the capacitance measuring wiring 17 and the second testing wiring 15 face each other is represented by S.

When the capacitance before letting the stress current flow is represented by $C_{T0}$, $C_{T0}$ becomes equal to $\epsilon_0 \cdot t \cdot L/d$, since S is equal to t·L.

On the other hand, the capacitance $C_{Tn}$, at the time Tn passes from the start of letting the stress current flow so that voids are formed, becomes equal to $\epsilon_0 \cdot t \cdot (L-l)/d$, since S is equal to t·(L-l).

From these results, the following equation (1) is obtained:

$$C_{Tn}/C_{T0}=1-l/L \qquad (1)$$

Since the capacitance ratio $C_{Tn}/C_{T0}$ can be obtained from the result measured with the capacitance meter 3 and L is already known, the value of l can be obtained from the equation (1). When $C_{Tn}$ is measured, the electric current source 2 is switched off with a non-illustrated means so that the stress current does not flow. This is for prevention of change in capacitance during measurement.

Therefore, if the void 18 uniformly grows along the longitudinal direction of the second testing wiring 15, the volume of the void 18 is a value obtained by multiplying the section area of the second testing wiring 15 by the value l. The calculation described above is carried out by the computer 4. The computer 4 provides the volume of the void, that is, the wiring life span.

As described above, in the present embodiment the wiring life span is defined by the void volume itself, thereby not causing in the problem that the wiring life span seems longer because the testing wiring is longer. This is different from the wiring life span defined by the aforementioned resistance rise rate.

Therefore, the method for evaluating wirings according to the present embodiment is a method by which the genuine wiring life span can be evaluated and is practical because this method, which is different from conventional methods of using resistance, does not cause the problem in that the design for the device becomes complicated.

According to the embodiment, the capacitance ratio $C_{Tn}/C_{T0}$ is used to obtain the volume of voids from the nondestructive test. For the single multilayer wiring structure, measurement of capacitance can be repeated in the same manner and a plurality of wiring life spans can be obtained from a plurality of capacitance ratios because of using the nondestructive test. Accordingly, it is possible to make the variation in measured results small and evaluate the wiring life span accurately by taking an arithmetic mean of these results.

Figure 7:
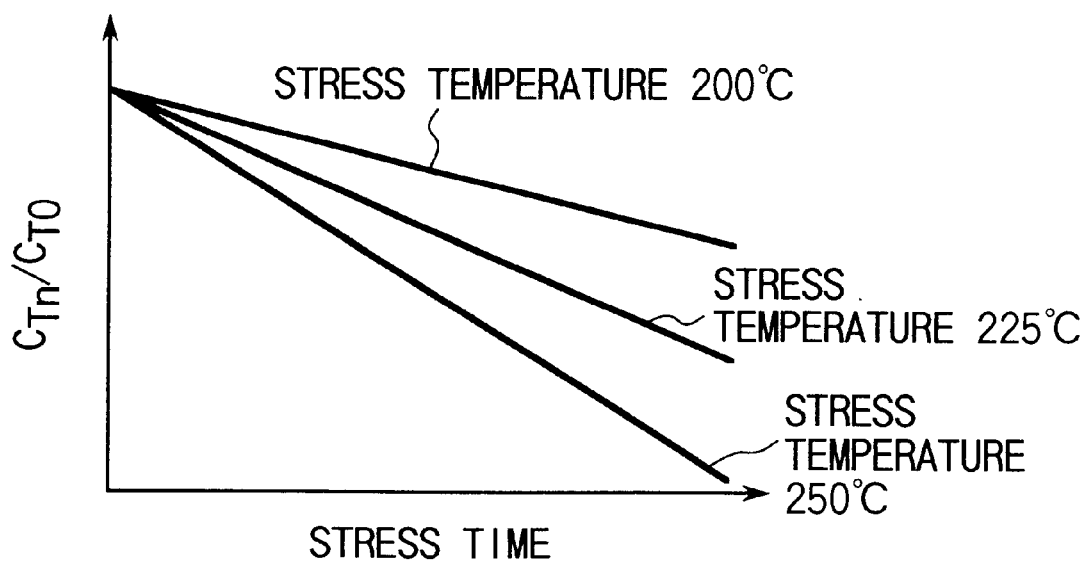
FIG. 7 is a view showing the relationship between stress temperature and the period of letting a stress current flow.

FIG. 7 shows the relationship between the stress temperature and the period during letting a stress current flow. This figure demonstrates that it is possible to carry out the measurement with a high sensitivity even at a stress temperature as high as conventional stress temperature because the capacitance ratio $C_{Tn}/C_{T0}$ is large at such temperature.

Figure 8:
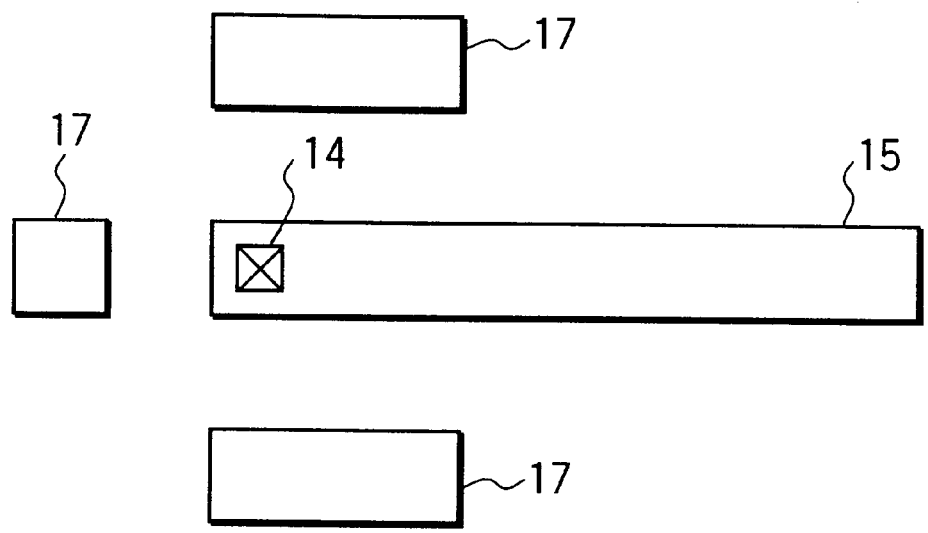
FIG. 8 is a top view illustrating another pattern of the capacitance measuring wiring of the first embodiment.

In the present embodiment, the capacitance measuring wiring 17 is disposed at only one side of the testing wiring to make explanation simpler. As shown in FIG. 8, however, it is possible to evaluate the wiring life span more precisely by disposing many capacitance measuring wirings 17 in the manner that they surround the testing wiring. Namely, it is possible to evaluate the wiring life span more precisely by obtaining the average of the wiring life spans obtained for respective capacitance measuring wirings 17.

In the embodiment, the length L, which is the length of the capacitance measuring wiring, may be made as long as that of the testing wiring, so that sensitivity for detecting voids can be improved. In many case, the length L may be about 100 $\mu$m.

Figure 9:
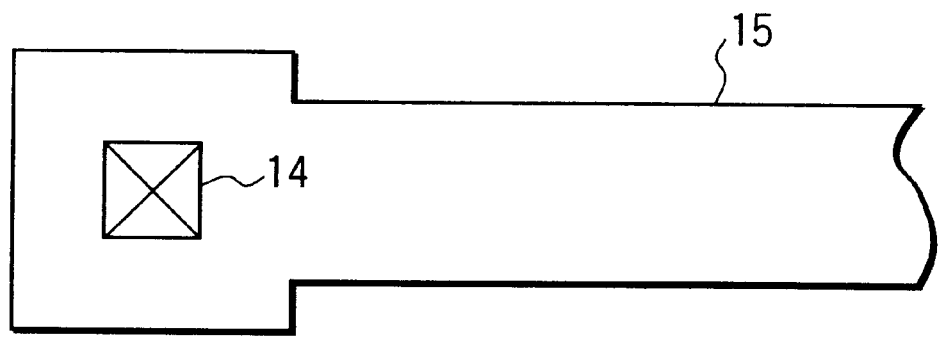
FIG. 9 is a top view illustrating another pattern of the testing wiring of the first embodiment.

In the embodiment, the pattern of the testing wiring is made into a stripe pattern having a constant wiring width to make explanation simpler; however, the pattern may be made into one where the wiring width is broadened around connecting holes as shown in FIG. 9.

In the embodiment, the multilayer wiring structure 1 is explained as a part of an evaluating system, but may be integrated inside an actual chip. Specifically, the multilayer wiring structure 1 is formed beforehand in each of the chips before the chips are subjected to a dicing treatment; the EM-evaluating test is performed; the wafer is subsequently cut and separated into respective chips; and then chips passing the EM-evaluating test are chosen (This process may be applied to other embodiments in the same manner).

Figure 10:
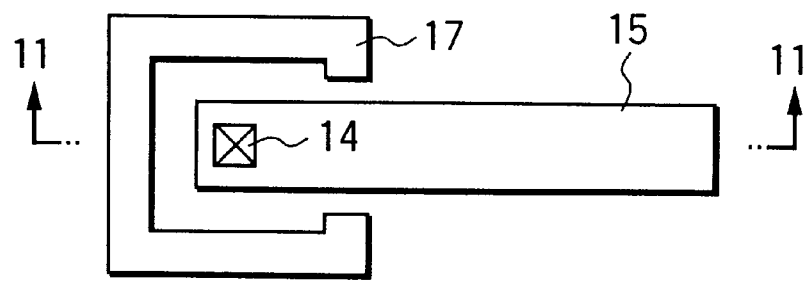
FIG. 10 is a top view illustrating a multilayer wiring structure according to the second embodiment of the invention.
Figure 11:
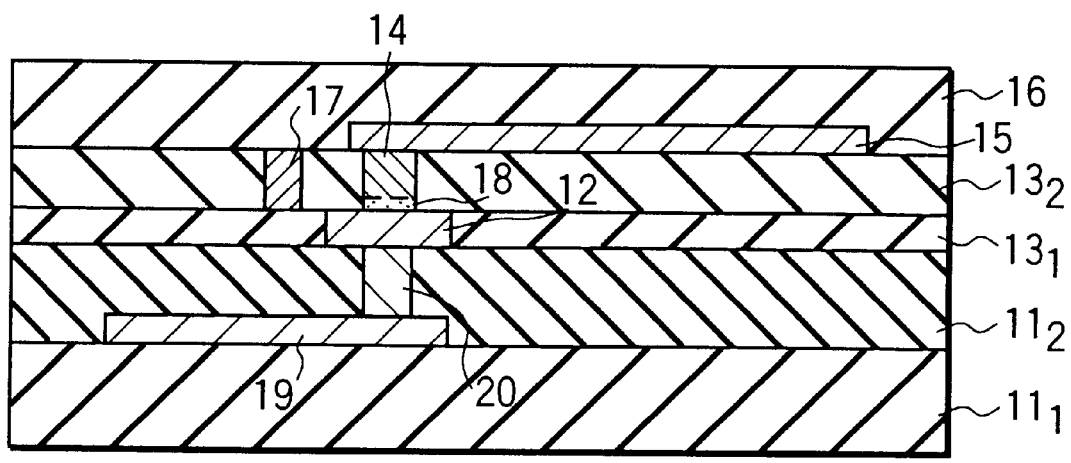
FIG. 11 is an 11—11 section of the multilayer wiring structure shown in FIG. 10.

The Second Embodiment:

FIG. 10 is a top view illustrating a multilayer wiring structure according to the second embodiment of to the present invention. FIG. 11 shows an 11—11 section of the multilayer wiring structure shown in FIG. 10.

The present embodiment is different from the first embodiment in that resistance to EM of the connecting plug 14, not of the testing wirings 12 and 15 is evaluated. Specifically, in the present embodiment the capacitance measuring wiring 17 is disposed around the connecting plug 14 through the insulator film 13$_2$.

In this figure, reference numbers 11$_1$ and 11$_2$ represent insulator films. The insulator films 11$_1$ and 11$_2$ correspond to the first insulator film 11 shown in FIG. 4. Reference numbers 20 and 19 represent a connecting plug and the third testing wiring, respectively. The third testing wiring 19, the connecting plug 20 and the testing wiring 12 correspond to the first testing wiring 12 shown in FIG. 4. This structure is based on that the same conductive film is patterned to form the connecting plug 14 and the capacitance measuring wiring 17.

The material of the connecting plug 14 is different from the material of the portion of the testing wiring 12 contacting the connecting plug 14. In such a case, a void 18 is produced at the connecting plug 14 by EM.

Specifically, the connecting plug 14 and the first testing wiring 12 may be, for example, an Al contact and a diffused layer formed on the surface of a silicon substrate, respectively, or may be an Al via conductor and a lower Al wiring on which a barrier metal such as TiN is formed.

In the present embodiment, the life span of the connecting plug 14 can be also estimated in the same manner as in the first embodiment, and the same advantages can be obtained.

Figure 12:
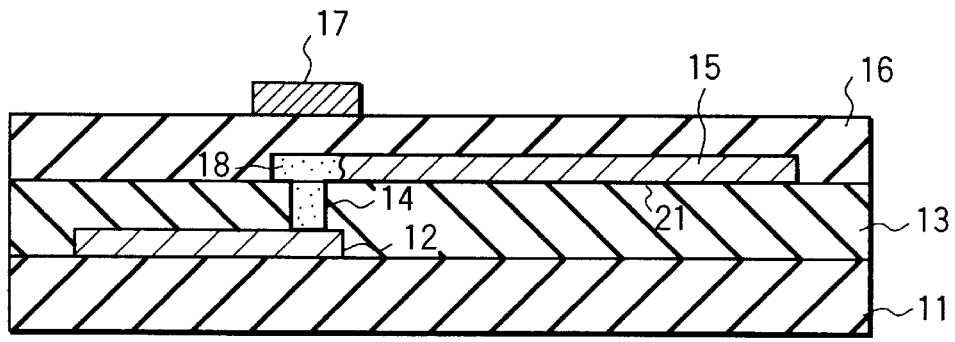
FIG. 12 is a cross section illustrating a multilayer wiring structure according to the third embodiment of the invention.

The Third Embodiment:

FIG. 12 is a cross section illustrating a multilayer wiring structure according to the third embodiment of to the present invention, and corresponds to the cross section of FIG. 4.

The multilayer wiring structure of the present embodiment is for evaluating resistance to EM of the wiring in a damascene wiring or a dual damascene wiring and is different from the first embodiment in that the capacitance measuring wiring 17 is formed through the insulator film 16 on the second testing wiring 15 and that a liner material 21 is disposed on the bottom and side faces of a groove.

The liner material 21 may be the same liner material as used in a damascene process or a dual damascene process, and specifically it may be titanium, titanium nitride, niobium, tantalum aluminum.

These materials have a higher resistance to EM than the wiring material of the second testing wiring 15 and the connecting plug 14 (for example, aluminum, aluminum alloy, and copper). Thus, even if an electric current is sent to produce a void 18 as shown in FIG. 12, the electric current continues to flow by means of the liner material 21 so that the void 18 grows in the right direction in FIG. 12.

For this reason, the area where the second testing wiring 15 and the capacitance measuring wiring 17 face each other becomes smaller as the void 18 grows. Accordingly, the wiring life span can be defined by the void per se in the same manner as in the first embodiment, and the same advantages can be obtained.

Figure 13:
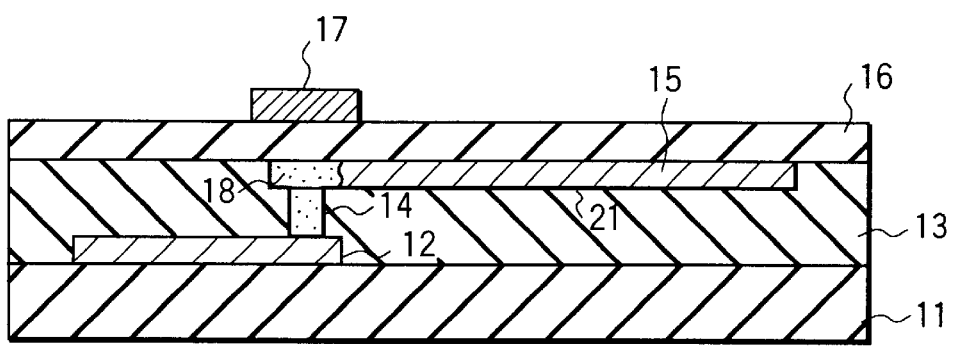
FIG. 13 is a cross section illustrating a variation of the multilayer wiring structure shown in FIG. 12.

In FIG. 12, the second testing wiring 15 is illustrated in an RIE wiring (a damascene wiring) form, but may be in a dual damascene wiring form as shown in FIG. 13. In this case, the flatness of the insulator film 16 can be improved to form a more ideal parallel-plate capacitor; therefore measurement with a higher precision can be carried out.

Figure 14:
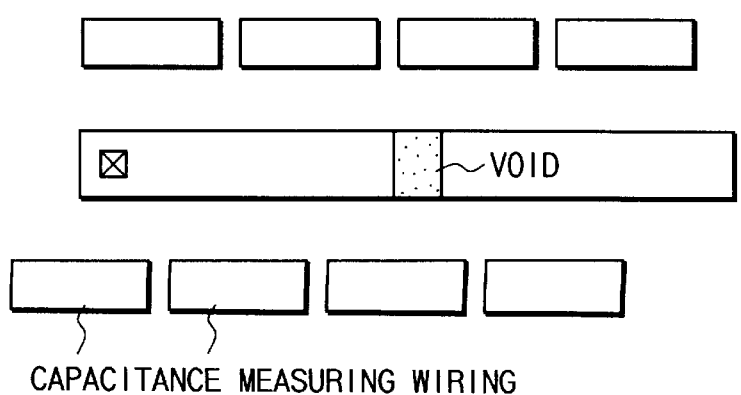
FIG. 14 is a top view illustrating 2 multilayer wiring structure according to the fourth embodiment of the invention.

The Fourth Embodiment:

FIG. 14 is a top view illustrating a multilayer wiring structure relating to the fourth embodiment according to the present invention. In the multilayer wiring structure of the embodiment, a capacitance measuring wiring is separated into plural wirings. A void may be produced at the middle point of a testing wiring, depending on the process condition. In this case, use of the separated capacitance measuring wirings results in an advantage that a defect point (void) can be easily specified. The testing wiring has a total length of about 100 μm. Thus, use of the separated capacitance measuring wirings makes the sensitivity for detecting voids higher than use of a capacitance measuring wiring having a length as long as the testing wiring. With respect to the arrangement of the separated capacitance measuring wirings, it is preferable that the positions of the separated portions do not coincide with each other at both sides of the testing wiring as shown in FIG. 14.

As described in detail, according to the present invention, the volume of voids in a wiring is obtained by measuring capacitance and the wiring life span is defined by the void volume per se, so that EM-evaluation can be carried out precisely and effectively.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A wiring evaluating method for a multilayer wiring in which on a first wiring a second wiring is disposed through an insulator film and the first wiring is connected through a connecting member fitted to an opening of the insulator film to the second wiring, comprising the steps:

disposing a capacitance measuring wiring which constitutes a capacitor together with the multilayer wiring structure;

supplying a stress current to the multilayer wiring; and using change in the capacitance of the capacitor to evaluate resistance to electromigration of the multilayer wiring.

2. A wiring evaluating method for a multilayer wiring in which on a first wiring a second wiring is disposed through an insulator film and the first wiring is connected through a connecting member fitted to an opening of the insulator film to the second wiring, comprising the steps:

disposing a capacitance measuring wiring which constitutes a capacitor together with the multilayer wiring structure;

measuring the capacitance of the capacitor before supplying a stress current to the multilayer wiring;

supplying the stress current to the multilayer wiring for a period and subsequently measuring the capacitance of the capacitor under the condition of stopping supplying the stress current;

obtaining the volume of voids produced in the multilayer wiring by supplying the stress current, from the ratio of capacitances before and after supplying the stress current; and evaluating resistance to electromigration of the multilayer wiring on the basis of the volume of the voids.

3. A wiring evaluating method for a multilayer wiring in which on a first wiring a second wiring is disposed through an insulator film and the first wiring is connected through a connecting member fitted to an opening of the insulator film to the second wiring, comprising:

the first step of disposing a capacitance measuring wiring which constitutes a capacitor together with the multilayer wiring structure;

the second step of measuring the initial capacitance of the capacitor before supplying a stress current to the multilayer wiring;

the third step of supplying the stress current to the multilayer wiring for a period and subsequently measuring the capacitance of the capacitor under the condition of stopping supplying the stress current;

the fourth step of obtaining the volume of voids produced in the multilayer wiring by supplying the stress current, from the ratio of capacitances obtained in the second and third steps;

the fifth step of restarting supplying the stress current and supplying the stress current to the multilayer wiring for a period, and subsequently measuring the capacitance of the capacitor under the condition of stopping supplying the stress current;

the sixth step of obtaining the volume of voids produced in the multilayer wiring by supplying the stress current, from the ratio of capacitances obtained in the second and fifth steps;

the seventh step of repeating the fifth and sixth steps at least once to obtain the volume of the voids a plurality of times; and the eighth step of evaluating resistance to electromigration of the multilayer wiring on the basis of the plural volumes of the voids obtained in the fourth and seventh steps.

4. A wiring evaluating method according to claim 3, wherein the resistance to electromigration of the multilayer wiring is evaluated on the basis of an average volume obtained by taking an arithmetic mean of the plurality of volumes of the voids.

5. A wiring evaluating method according to claim 1, wherein the capacitance measuring wiring is disposed to surround at least one part of the first or second wiring, or the connecting member.

6. A wiring evaluating apparatus for evaluating resistance to electromigration of a multilayer wiring in which on a first wiring a second wiring is disposed through an insulator film and the first wiring is connected through a connecting member fitted to an opening of the insulator film to the second wiring, comprising:

a capacitance measuring wiring which constitutes a capacitor together with the multilayer wiring;

a stress current supplying device for supplying a stress current to the multilayer wiring;

a capacitance measuring device for measuring the capacitance of the capacitor; and an evaluating means for evaluating resistance to electromigration of the multilayer wiring by using data obtained with the capacitance measuring device.

* * * * *